United States Patent [19]
Jang et al.

[11] Patent Number: 5,672,989
[45] Date of Patent: Sep. 30, 1997

[54] NONVOLATILE SEMICONDUCTOR INTEGRATED CIRCUIT HAVING AN ADDRESS TRANSITION DETECTOR

[75] Inventors: Cheol-Ung Jang; Hyong-Gon Lee; Sung-Hee Cho, all of Suwon, Rep. of Korea

[73] Assignee: Samsung Electronics Co., Ltd., Suwon, Rep. of Korea

[21] Appl. No.: 590,602

[22] Filed: Jan. 24, 1996

Related U.S. Application Data

[63] Continuation of Ser. No. 227,647, Apr. 14, 1994, abandoned.

[30] Foreign Application Priority Data

Apr. 14, 1993 [KR] Rep. of Korea .................. 6211/1993
Feb. 7, 1994 [KR] Rep. of Korea .................. 2308/1994

[51] Int. Cl.⁶ .................................................... H03L 7/00
[52] U.S. Cl. .................................... 327/143; 365/233.5
[58] Field of Search ................................ 327/142, 143, 327/292, 293, 299, 198; 365/227, 233.5

[56] References Cited

U.S. PATENT DOCUMENTS

| | | | |
|---|---|---|---|
| 4,318,119 | 3/1982 | Tatsuzawa | 358/8 |
| 4,376,268 | 3/1983 | Moriya et al. | 331/10 |
| 4,393,412 | 7/1983 | Tatami | 358/318 |
| 4,551,841 | 11/1985 | Fujita et al. | 327/142 |
| 4,577,241 | 3/1986 | Wilkinson | 360/51 |
| 4,613,827 | 9/1986 | Takamori et al. | 331/20 |
| 4,737,866 | 4/1988 | Ebata | 360/51 |
| 4,744,063 | 5/1988 | Ohtani et al. | 365/227 |
| 5,068,626 | 11/1991 | Takagi et al. | 331/17 |
| 5,091,889 | 2/1992 | Hamano et al. | 365/233.5 |
| 5,124,594 | 6/1992 | Numata et al. | 307/528 |
| 5,132,937 | 7/1992 | Tuda et al. | 365/233.5 |
| 5,153,530 | 10/1992 | Takagi et al. | 331/17 |
| 5,175,654 | 12/1992 | Saito et al. | 360/51 |
| 5,233,316 | 8/1993 | Yamada et al. | 331/45 |
| 5,400,282 | 3/1995 | Suzuki et al. | 365/201 |
| 5,428,580 | 6/1995 | Kawashima et al. | 365/233.5 |
| 5,438,550 | 8/1995 | Kim | 365/233.5 |

*Primary Examiner*—Timothy P. Callahan
*Assistant Examiner*—Jung Ho Kim
*Attorney, Agent, or Firm*—Cushman Darby & Cushman, IP Group of Pillsbury Madison & Sutro LLP

[57] ABSTRACT

A semiconductor integrated circuit having an address transition detector includes a power detecting circuit connected to a source terminal for detecting a voltage level of the source terminal, a pulse generating circuit for receiving an address signal and generating a pulse when the address signal is changed, and a summator for combining outputs of the power detecting circuit and the pulse generating circuit and generating a given pulse when the outputs vary.

7 Claims, 11 Drawing Sheets

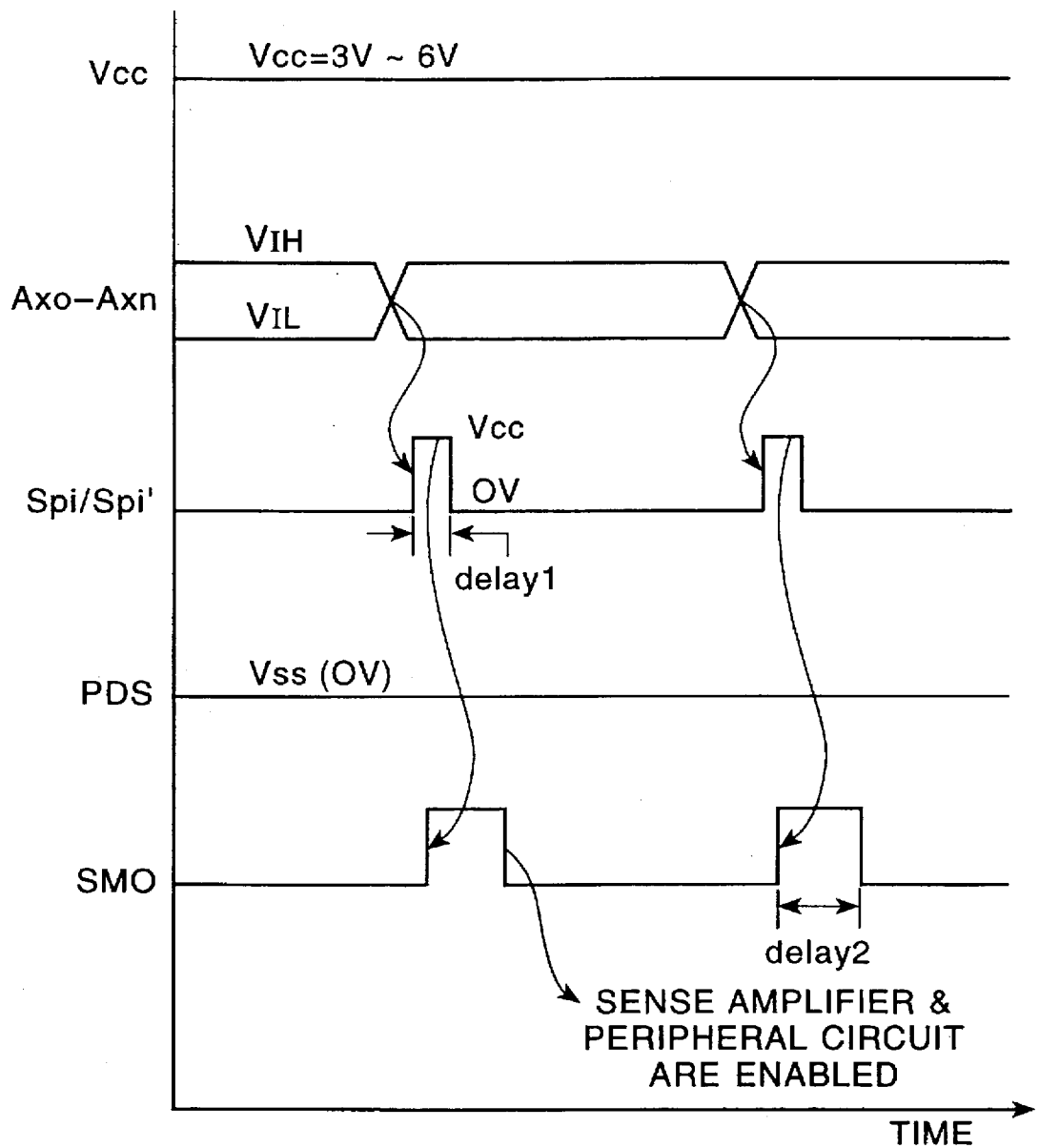

NONVOLATILE SEMICONDUCTOR INTEGRATED CIRCUIT HAVING AN ADDRESS TRANSITION DETECTOR

This is a continuation of application Ser. No. 08/227,647, filed Apr. 14, 1994, now abandoned.

BACKGROUND OF THE INVENTION

The present invention relates to semiconductor integrated circuits, more particularly to a semiconductor integrated circuit having an address transition detector.

Asynchronous semiconductor integrated circuits typically use an address transition detector (ATD) circuit for generating a clock pulse on board the chip. Use of the ATD circuit reduces power consumption and achieves high speed signal transmission by driving each circuit on the chip by using the generated clock pulse.

FIG. 1 is a block diagram showing a semiconductor integrated circuit having typical ATD and peripheral circuits. If any external address signals applied through input buffer 10 vary, a pulse is generated from ATD circuit 20, and precharge and equalization circuit 22 and sense amplifier and data latch circuit 26 correspondingly operate.

FIG. 2a is a block diagram illustrating a conventional ATD circuit, FIG. 2b is a more detailed circuit diagram of short pulse generating circuit 38 of FIG. 2a, and FIG. 2c is a more detailed circuit diagram of summator 40 of FIG. 2a. In FIG. 2a, short pulse generating circuits 38 generate a short pulse by sensing variation of address signals Ax0,..., Axn or a chip enable signal $\overline{CEx}$ applied from the exterior of the chip. Summator 40 produces a pulse SMO by combining the outputs of short pulse generating circuits 38. The output SMO of summator 40 is used as an input of sense amplifier and data latch circuit 26 or precharge and equalization circuit 22, of FIG. 1.

Short pulse generating circuits 38 are illustrated in greater detail in FIG. 2b. Internal address signals Ap0,..., Apn are applied to a delay circuit 42 which contains an odd number of inverters so that any input signal is output as a delayed and inverted signal. If one of the internal address signals Ap0,..., Apn is changed, a pulse signal is generated from inverter 46 connected to NAND gate 44 or from NOR gate 48.

FIG. 2c illustrates the summator 40 of FIG. 2a. If one of the output signals Sp0, Sp0',..., Spn, Spn' of the short pulse generating circuits 38 is set to logic level "high", one of NMOS transistors 54a, 54b,..., 56a, 56b is turned on and the output pulse SMO at a logic "high" level is generated.

The operation of the conventional ATD circuit will now be described with reference to FIGS. 3a and 3b. Short pulse generating circuits 38 generate a short pulse by sensing address signals Ap0,..., Apn or chip enable signal $\overline{CEx}$. Output signals Sp0,..., Spn generate a pulse when address signals Ap0,..., Apn are lowered to logic level "low" from logic level "high". Output signals Sp0',..., Spn' generate a pulse when address signals Ap0,..., Apn are raised to logic level "high" from logic level "low". A pulse width of output signals Sp0,..., Spn' has logic level "high" during the delay time of delay circuit 42. Output signals Sp0, Sp0',..., Spn, Spn' of the short pulse generating circuit 38 are applied to summator 40 and summator 40 produces sense amplifier and peripheral circuit enable signal SMO. If power supply voltage Vcc applied from the exterior of the chip is a constant voltage level (for example, 3–6V) which is capable of operating a sense amplifier or peripheral circuit, output signal SMO of summator 40 is normally enabled to logic level "high" and the circuit of FIG. 2a is normally operated as shown in FIG. 3a. However, if address signals Ax0,..., Axn and the chip enable signal $\overline{CEx}$ are fixedly applied before power supply voltage Vcc is supplied, output signal SMO enables the sense amplifier or peripheral circuit at a low power supply voltage (about 1.5V) as shown in FIG. 3b, and thus, does not sense cell data normally. Usually, the sense amplifier or peripheral circuit is enabled at an edge where output signal SMO is lowered to logic level "low" from logic level "high" as indicated by reference numeral 70. As a result, it is difficult to generate normal data during a read operation of the cell data.

SUMMARY OF THE INVENTION

It is an object of the present invention to provide a semiconductor integrated circuit for generating normal cell data by sensing the level of a power supply voltage during a read operation.

It is another object of the present invention to provide a semiconductor integrated circuit having an ATD circuit for enabling an output when a power supply voltage is raised to a voltage level to enable a sense amplifier or peripheral circuit.

It is still another object of the present invention to provide a semiconductor integrated circuit having an ATD circuit for cutting off an output when a power supply voltage applied from the exterior of the chip is not high enough to enable a sense amplifier or peripheral circuit.

It is yet another object of the present invention to provide a semiconductor integrated circuit having an ATD circuit for enabling an operation of a sense amplifier or peripheral circuit when the power supply voltage is sufficiently high and disabling the operation of the sense amplifier or peripheral circuit when the power supply voltage is low.

It is a further object of the present invention to provide an ATD circuit for generating normal cell data during a read operation by sensing the level of the power supply voltage and controlling the operation of a sense amplifier or peripheral circuit.

It is a still further object of the present invention to provide an ATD circuit for enabling an output operation when the power supply voltage is at a constant voltage level.

In accordance with one aspect of the present invention, a semiconductor integrated circuit includes an ATD circuit for detecting a power supply voltage as well as an address signal or a control signal applied from the exterior of the chip and being enabled when the power supply voltage is at a constant voltage level. The ATD circuit has a power detecting circuit connected to a source terminal, for detecting the voltage level of the source terminal, a short pulse generating circuit for receiving an address signal and generating a short pulse when the address signal is changed, and a summator for combining outputs of the power detecting circuit and the short pulse generating circuit and generating a pulse when the outputs vary.

BRIEF DESCRIPTION OF THE DRAWINGS

A more complete appreciation of this invention, and many of the attendant advantages thereof, will be readily apparent as it becomes better understood by reference to the following detailed description when considered in conjunction with the accompanying drawings in which like reference symbols indicate the same or similar components, wherein:

3

Figure 1:
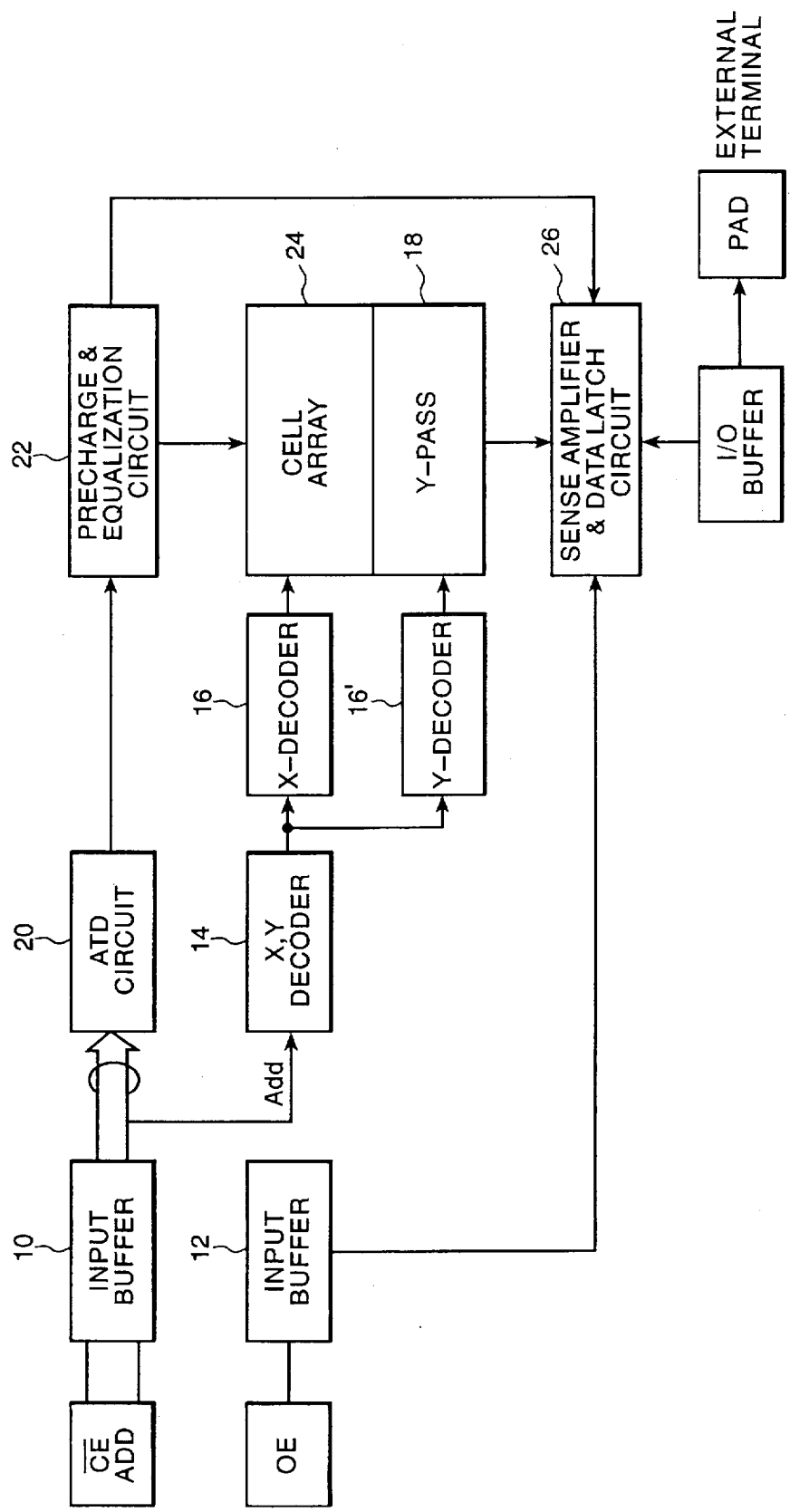
Figure 2A:
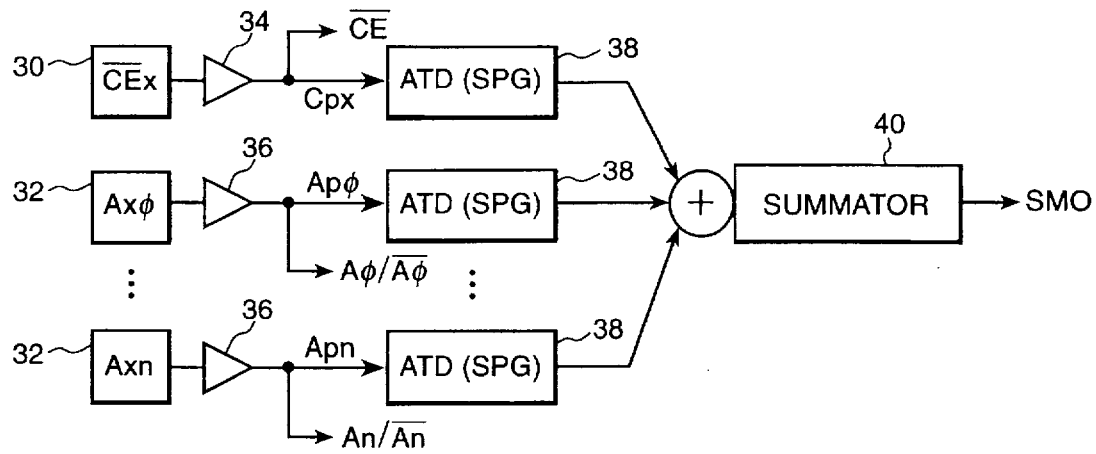
Figure 2B:
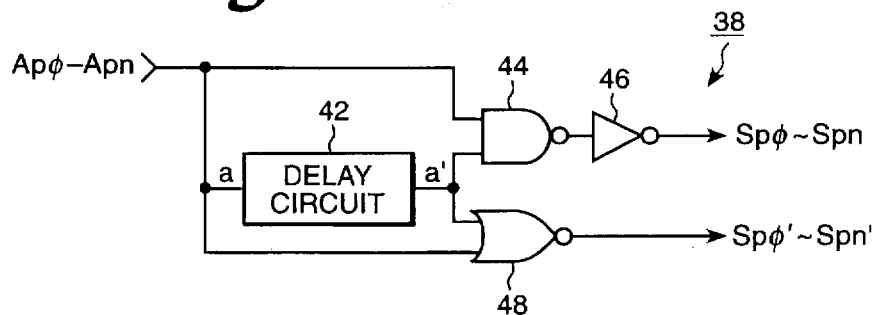
Figure 2C:
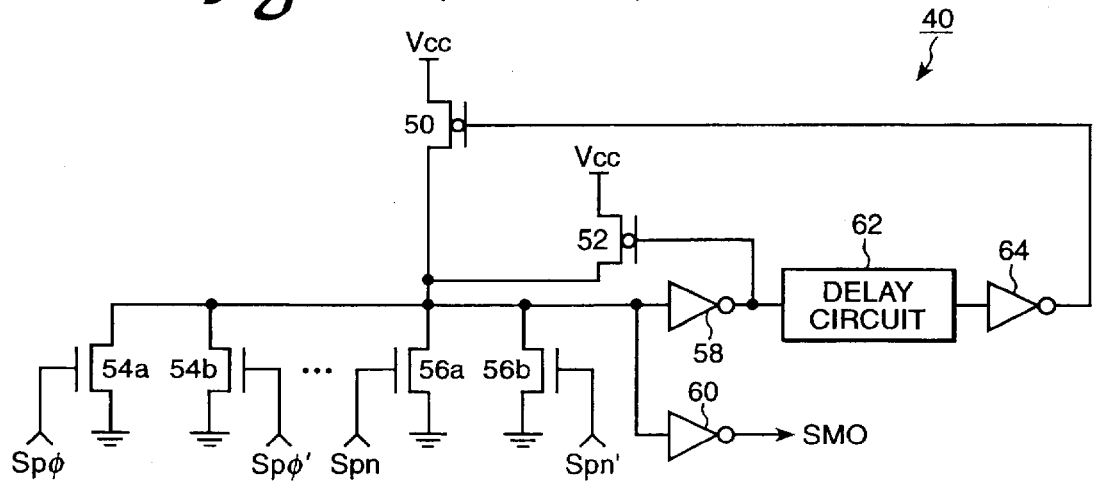
Figure 3A:
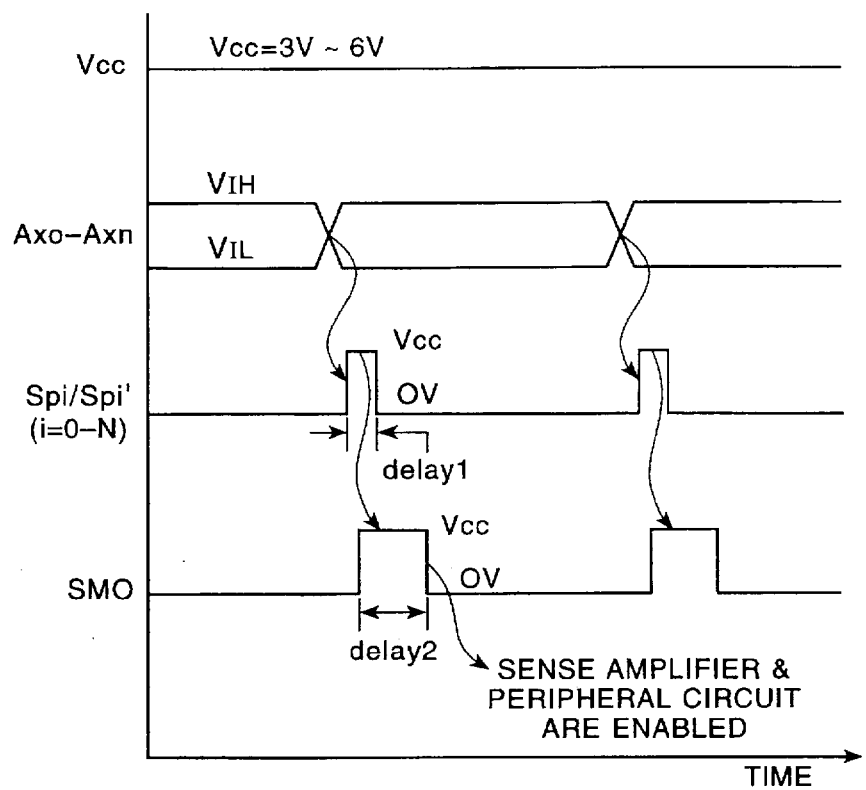
Figure 3B:
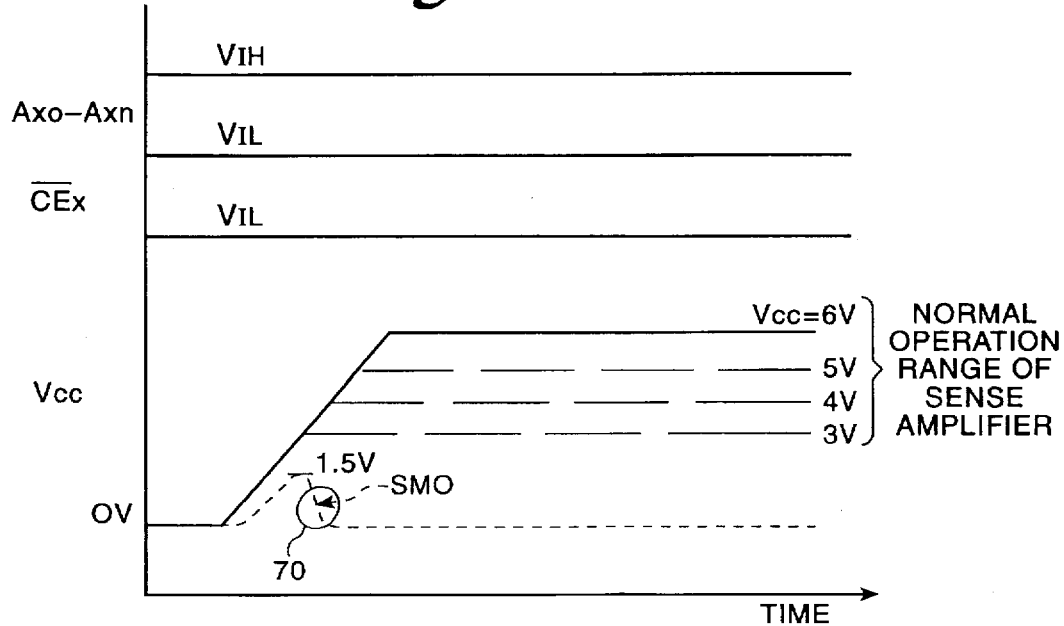
Figure 4:
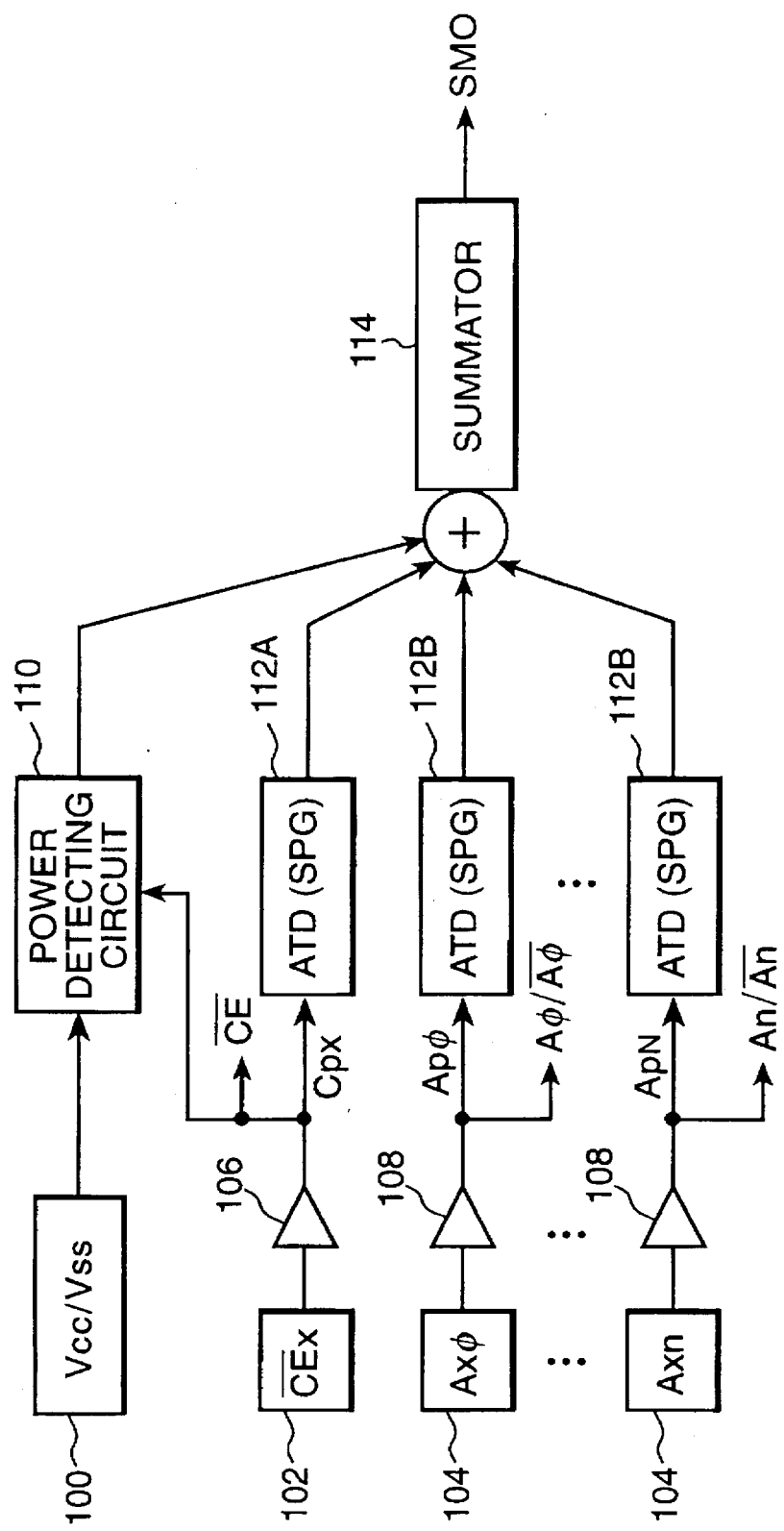
Figure 5A:
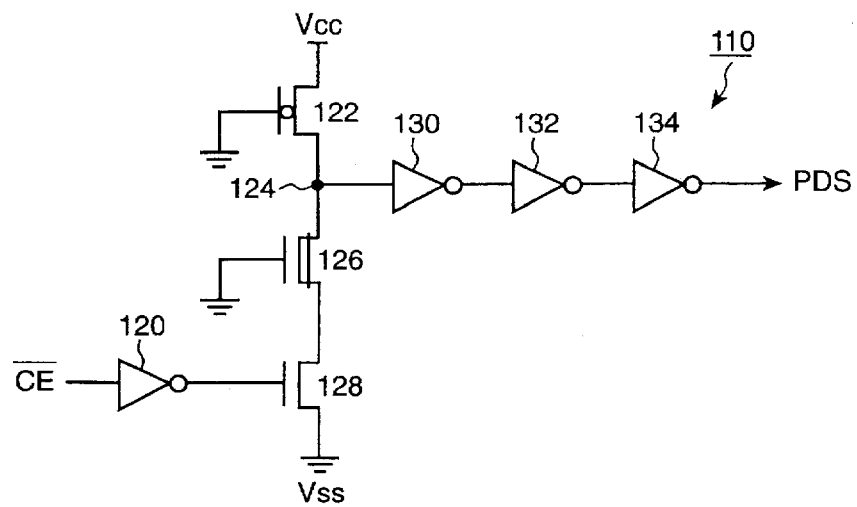
Figure 5B:
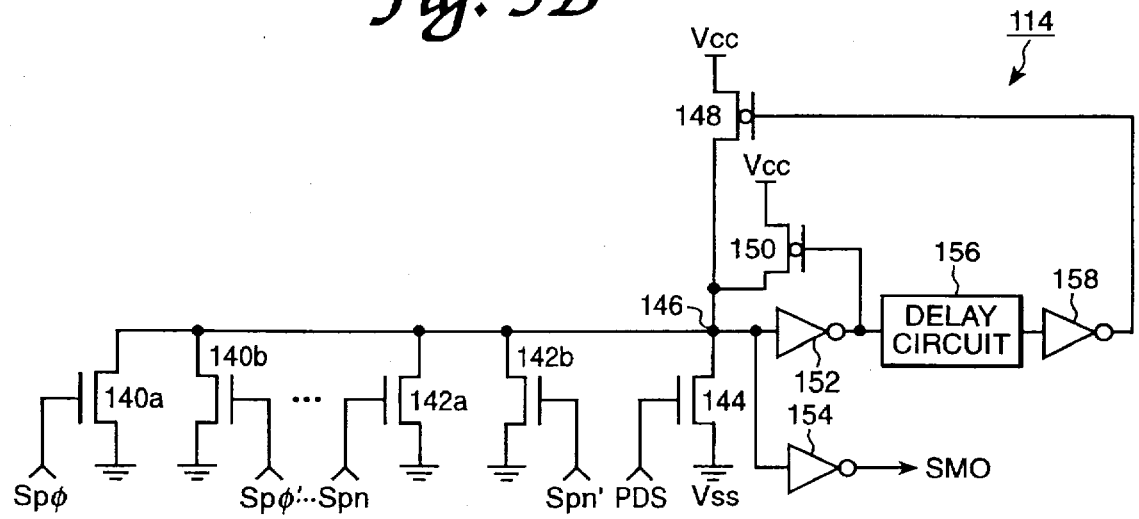
Figure 6B:
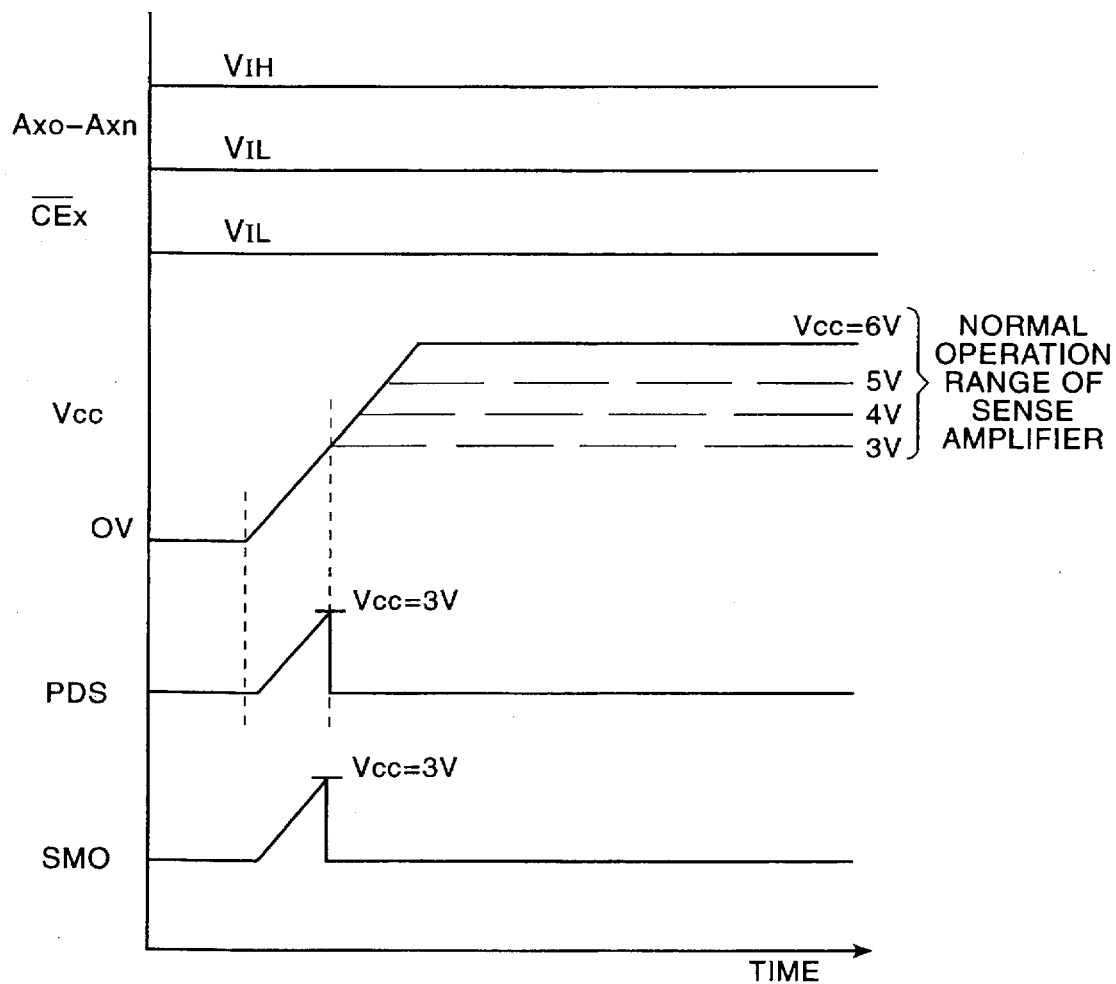
Figure 7:
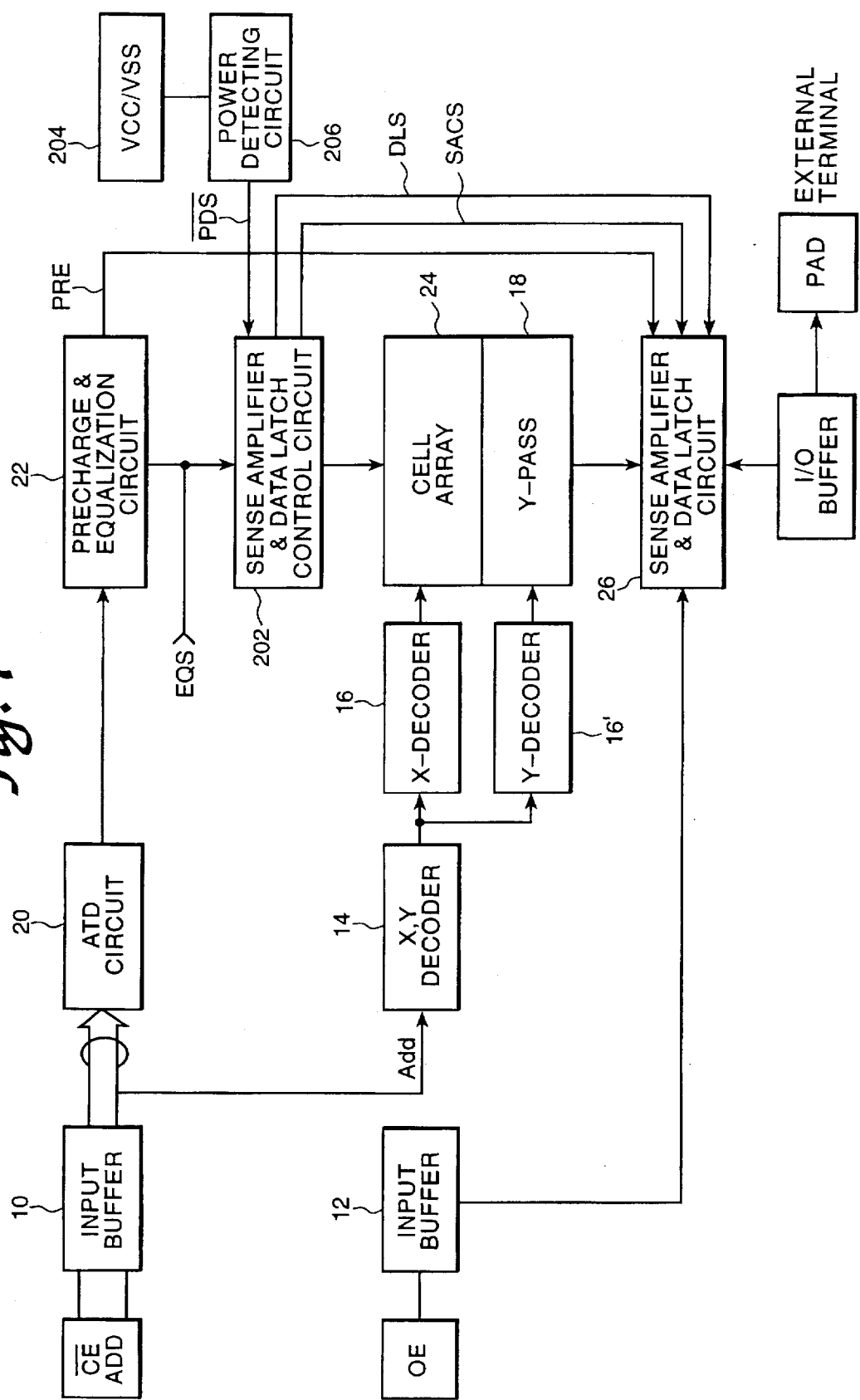
Figure 8:
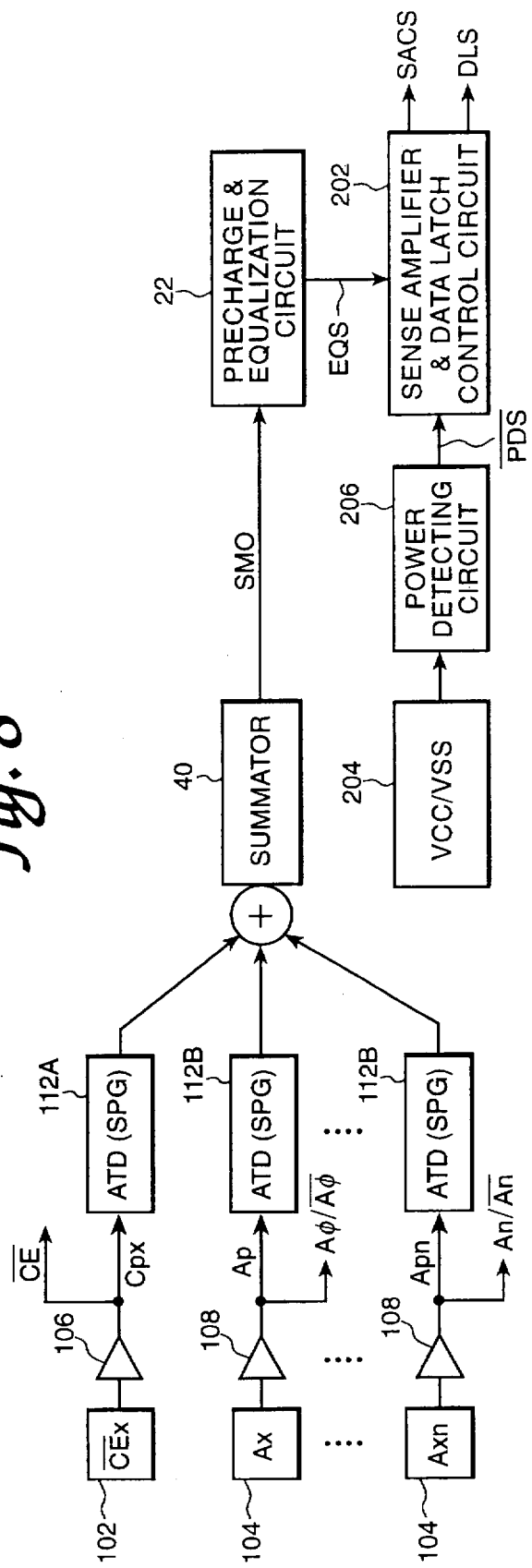
Figure 9:
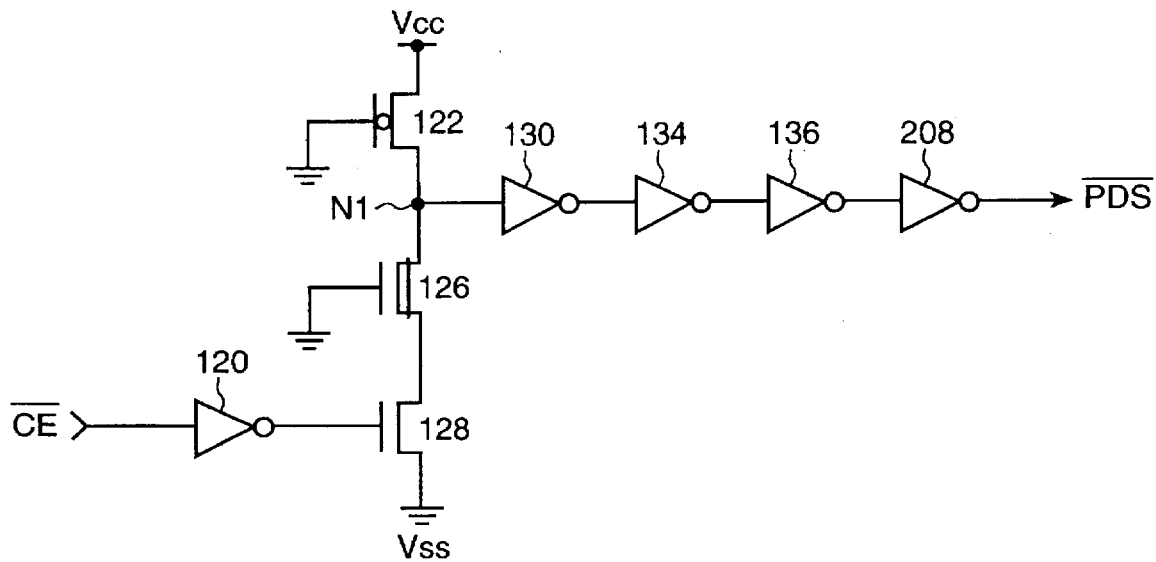
Figure 10:
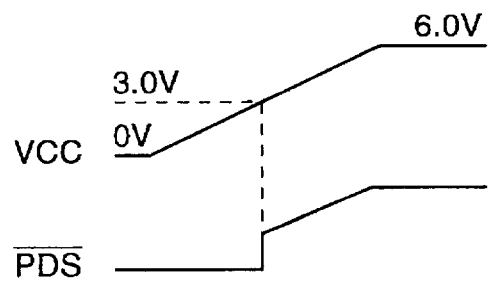
Figure 11:
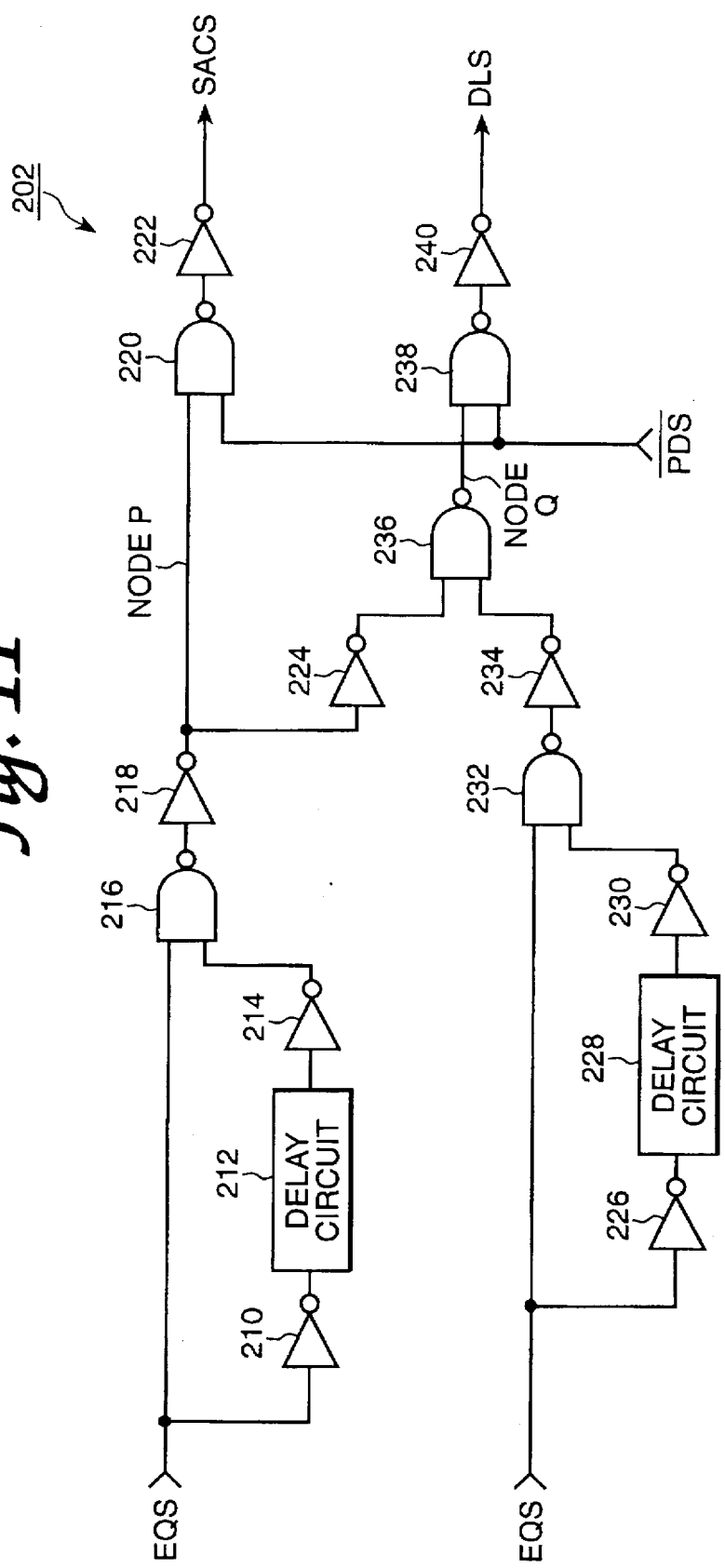

FIG. 1 is a block diagram showing a typical semiconductor integrated circuit including an ATD and peripheral circuits;

FIG. 2a is a block diagram showing a conventional ATD circuit;

FIG. 2b is a more detailed circuit diagram showing a short pulse generating circuit of FIG. 2a;

FIG. 2c is a more detailed circuit diagram showing the summator of FIG. 2a;

FIG. 3a is a timing chart of each signal of the circuit of FIG. 2a when a power supply voltage is applied to the circuit of FIG. 2a;

FIG. 3b is a timing chart of each signal of the circuit of FIG. 2a when an address signal is applied to the circuit of FIG. 2a before a power supply voltage is supplied;

FIG. 4 is a block diagram showing an ATD circuit according to the present invention;

FIG. 5a is a more detailed circuit diagram showing the power detecting circuit of FIG. 4;

FIG. 5b is a more detailed circuit diagram showing the summator of FIG. 4;

FIG. 6a is a timing chart of each signal of the circuit of FIG. 4 when a power supply voltage is applied to the circuit of FIG. 4;

FIG. 6b is a timing chart of each signal of the circuit of FIG. 4 when an address signal is applied to the circuit of FIG. 4 before a power supply voltage is supplied;

FIG. 7 is a block diagram showing a semiconductor integrated circuit including ATD and peripheral circuits according to the present invention;

FIG. 8 is a block diagram of a second embodiment of the present invention showing the ATD and related circuits of FIG. 7;

FIG. 9 is a more detailed circuit diagram showing the power detecting circuit of FIG. 7;

FIG. 10 is a chart showing the power detecting signal of FIG. 7 versus power supply voltage; and FIG. 11 is a more detailed circuit diagram showing the sense amplifier and data latch control circuit of FIG. 7.

DETAILED DESCRIPTION OF THE PREFERRED EMBODIMENT

The term "summator" refers to a circuit constituting the final stage of an ATD circuit and it has been described as an output stage for combining each output from a plurality of short pulse generating circuits. However, in the explanation which will be described hereinafter, the term "summator" indicates a circuit for combining the output of a power detecting circuit in addition to the outputs from a plurality of short pulse generating circuits.

As shown in FIG. 4, power detecting circuit 110 is connected to source terminal 100 to which power supply voltage Vcc and ground voltage Vss are applied. Short pulse generating circuit 112A for detecting a control signal is connected to buffer 106 which is coupled to chip enable signal input terminal 102 and shapes chip enable signal CEx (supplied from the exterior of the chip) to an internal signal CE. Short pulse generating circuit 112B for detecting an address signal is connected to buffer 108 which is coupled to external address signal input terminal 104 and shapes external address signals Ax0, . . . , Axn to internal address signals Ap0, . . . , Apn. Summator 114 receives the outputs of power detecting circuit 110, short pulse generating circuit 112A for detecting the control signal and short pulse generating circuit 112B for detecting an address signal and generates control signal SMO for a sense amplifier or peripheral circuit.

The short pulse generating circuits 112A and 112B may be practiced with the circuit of FIG. 2b.

FIG. 5a shows the power detecting circuit 110 of FIG. 4 in greater detail. Power detecting circuit 110 has p-type transistor 122 with its channel connected between power supply voltage Vcc and node 124 and its gate connected to ground voltage Vss, depletion transistor 126 with one terminal of its channel connected to node 124 and its gate connected to ground voltage Vss, n-type transistor 128 with its channel connected between the other terminal of the channel of depletion transistor 126 and ground voltage Vss and its gate connected through an inverter 120 to chip enable signal CE, and a chain of inverters 130, 132 and 134, connected in series to node 124, for generating power detecting signal PDS. The n-type transistor 128 receiving an inverted signal of the chip enable signal CE prevents a direct connection from power supply voltage Vcc to ground voltage Vss during a stand-by mode from occurring. An external voltage level at which power detecting signal PDS is set to the ground voltage Vss may be made according to an input trip level of inverter 130. The p-type transistor 122 and depletion transistor 126 may be appropriately selected in consideration of logic. The circuit construction of power detecting circuit 110 may be similar to that disclosed in Korea Pat. No. 050919 (Appl. No. 1988-7929), filed Jun. 29, 1988, assigned to the same assignee as the present invention, and entitled "POWER VOLTAGE SENSING CIRCUIT" which issued on Apr. 18, 1992.

FIG. 5b shows the summator 114 of FIG. 4. Also provided is NMOS transistor 144 with its channel connected between connecting node 146 and ground voltage Vss and its gate connected to power detecting signal PDS. If one of output signals Sp0, Spn', . . . , Spn, Spn' of short pulse generating circuits 112A and 112B or power detecting signal PDS is set to logic level "high", connecting node 146 is set to logic level "low" due to one of transistors 140a, 140b, . . . 142a, 142b, 144 turning on and control signal SMO of logic level "high" is generated through an inverter 154.

The output operation of the ATD circuit will now be described with reference to FIGS. 6a and 6b. If power supply voltage Vcc applied from the exterior of the chip is constant, for example, 3–6V, the output state of power detecting signal PDS becomes a constant voltage level at the ground voltage Vss. Short pulse generating circuits 112A and 112B generate output signals Sp0, Sp0', . . . Spn, Spn by sensing variation of the address signal or chip enable signal, and summator 114 receiving the output signals Sp0, Sp0', . . . Spn, Spn', . . . Spn, generates control signal SMO. Since power supply voltage Vcc is constant, the ATD circuit and other circuits related thereto full-swing between power supply voltage Vcc and ground voltage Vss, thereby normally operating the sense amplifier or peripheral circuit. Thus, if power supply voltage Vcc is normally supplied, the ATD circuit has a signal characteristic as shown in FIG. 6a.

Meanwhile, if the address signal or the chip enable signal is applied before power supply voltage Vcc is supplied, the ATD circuit operates as follows. Such a case mainly occurs during a power-up operation of a chip. When the address signal or the chip enable signal is fixed to a voltage level $V_{IH}$ or $V_{IL}$ and the power supply voltage Vcc is raised from 0V to 6V (or 3V), with a slope of a given gradient, output signal PDS of power detecting circuit 110 is raised along with power supply voltage Vcc up to a prescribed voltage. The output signal PDS is set to logic level "low" when inverter 130 is over an input trip level. The description related thereto is described in detail in the above-noted Korea Pat. No. 050919. Then, since the output signal PDS disables output signal SMO of summator 114 until the sense amplifier or peripheral circuit is operable, the operation of the sense amplifier or peripheral circuit is disabled. Therefore, if power supply voltage Vcc is greater than the voltage level which is capable of normally operating the sense amplifier or peripheral circuit, the output signal PDS is set to logic level "low", and thus the output of summator 114 is driven. Consequently, the sense amplifier or peripheral circuit normally operates from the stable output signal of the summator and the normal cell data is read.

As described above, an enabling operation of the ATD circuit is determined by the level of the power supply voltage. Further, a stable operation of each circuit is ensured by driving the sense amplifier or peripheral circuit only when a sufficiently high power supply voltage is applied.

FIG. 7 shows a memory cell array of a semiconductor integrated circuit and peripheral circuit thereof according to the present invention. X, Y decoder 14 is connected to input buffer 10 for buffering address signal ADD applied from the exterior and designates a memory cell within memory cell array 24 by decoding address signal Add. ATD circuit 20 senses the transition of the address signal applied from the exterior. Sense amplifier and data latch control circuit 202 receives equalizing signal EQS generated from precharge and equalization circuit 22 and is controlled by power detecting signal $\overline{PDS}$ generated from power detecting circuit 206. Sense amplifier and data latch circuit 26 latches data produced through Y path 18 from the memory cell in response to precharge signal PRE generated from precharge and equalization circuit 22 and data latch signal DLS generated from sense amplifier and data latch control signal 202, and amplifies cell data controlled by sense amplifier control signal SACS.

If any one of external address signals received through input buffer 10 varies, ATD circuit 20 generates a pulse. The pulse generated from ATD circuit 20 produces a control signal necessary for precharge and equalization circuit 22 and sense amplifier and data latch control circuit 202, and the control signal is applied to sense amplifier and data latch circuit 26 to control the transmitting of data read from memory cell array 24 to the exterior or writing data into memory cell array 24. Sense amplifier and data latch control circuit 202 is controlled by power detecting signal $\overline{PDS}$ produced from power detecting circuit 206. Power detecting circuit 206 is connected to source circuit 204 to which power supply voltage Vcc and ground voltage Vss are applied.

FIG. 8 shows the ATD circuit and related circuits of FIG. 7 for a second embodiment of the present invention. In the ATD circuit of FIG. 4 summator 114 receives power detecting signal PDS generated from power detecting circuit 110, the output signal of short pulse generating circuit 112A for detecting the control signal and output signals SpO, SpO', . . . Spn, Spn' of short pulse generating circuit 112B for detecting the address signals, and generates control signal SMO for controlling precharge and equalization circuit 22. In the ATD circuit of FIG. 8, summator 40 receives the output signal of the short pulse generating circuit for detecting the control signal and the output signals SpO, SpO', . . . Spn, Spn' of the short pulse generating circuit for detecting the address signals and generates the control signal SMO for controlling precharge and equalization circuit 22. Short pulse generating circuit 112A for detecting the control signal is connected to buffer 106 which is coupled to chip enable signal input terminal 102 and shapes chip enable signal CEx supplied from the exterior to an internal signal $\overline{CE}$. Short pulse generating circuit 112B for detecting the address signal is connected to buffer 108 which is coupled to external address signal input terminal 104 and shapes external address signals AxO, . . . , Axn to internal address signals ApO, . . . , Apn. Summator 40 receives the outputs of short pulse generating circuits 112A and 112B and generates the control signal SMO for controlling precharge and equalization circuit 22. Sense amplifier and data latch control circuit 202 is controlled by power detecting signal $\overline{PDS}$ generated from power detecting circuit 206.

The short pulse generating circuits 112A and 112b of FIG. 8 have the same construction as the circuit of FIG. 2b. The summator 40 may be identically practiced with the circuit of FIG. 2c.

FIG. 9 shows the power detecting circuit 206 of FIG. 7. The power detecting circuit has p-type transistor 122 with its channel connected between power supply voltage Vcc and node N1 and its gate connected to ground voltage Vss, depletion transistor 126 with one terminal of its channel connected to node N1 and its gate connected to ground voltage Vss, n-type transistor 128 with its channel connected between the other terminal of the channel of depletion transistor 126 and ground voltage Vss and its gate connected through inverter 120 to chip enable signal CE, and a chain of inverters 130, 134, 136 and 208 connected in series to node N1 for generating power detecting signal $\overline{PDS}$.

FIG. 11 shows the sense amplifier and data latch control circuit 202 of FIG. 7. Sense amplifier and data latch control circuit 202 includes first inverter 210 for receiving equalizing signal EQS generated from precharge and equalization circuit 22, first delay circuit 212 for delaying the output of inverter 210 during a given period of time, second inverter 214 connected to the output of delay circuit 212, first NAND gate 216 for receiving equalizing signal EQS and the output of inverter 214, third inverter 218 connected to NAND gate 216, second NAND gate 220 for receiving the output of inverter 218 and power detecting signal $\overline{PDS}$, and fourth inverter 222 for receiving the output of NAND gate 220 and generating sense amplifier control signal SACS. There is also provided fifth inverter 226 for receiving equalizing signal EQS, second delay circuit 228 for delaying the output of inverter 226 for a given period of time, sixth inverter 230 connected to the output of delay circuit 228, third NAND gate 232 for receiving equalizing signal EQS and the output of inverter 230, seventh inverter 234 for receiving the output of NAND gate 232, eighth inverter 224 for receiving the output of inverter 218, fourth NAND gate 236 for receiving the outputs of inverters 224 and 234, fifth NAND gate 238 for receiving the output of NAND gate 236 and power detecting signal PDS, and ninth inverter 240 for receiving the output of NAND gate 238 and generating data latch signal DLS.

If the address signal and the chip enable signal supplied from the exterior are fixed to a voltage level $V_{IH}$ or $V_{IL}$ and power supply voltage Vcc is raised from 0V with a given slope, power detecting signal $\overline{PDS}$ generated from power detecting circuit 206 is maintained at logic level "low" within the range of the power supply voltage Vcc of 0.0V–3.0V, as shown in FIG. 10. Then sense amplifier control signal SACS and data latch signal DLS become logic level "low" irrespective of nodes P and Q by power detecting signal $\overline{PDS}$ of logic level "low" which is input to NAND gates 220 and 238 of sense amplifier and data latch control circuit 202 of FIG. 11. Therefore sense amplifier and data latch circuit 26 of FIG. 7 is continuously enabled. That is, even if the power supply voltage is 0.0V–3.0V, a data latch operation can be implemented.

On the other hand, if the power supply voltage Vcc is 3.0V–6.0V, the power detecting signal $\overline{PDS}$ is set to logic level "high" as shown in FIG. 10 and has no effect on the outputs of NAND gates 220 and 238 of FIG. 11. Hence, sense amplifier and data latch control circuit 202 receiving equalizing signal EQS produced from precharge and equalization circuit 22 generates sense amplifier control signal SACS and data latch signal DLS in pulse form. Thus a normal operation of the semiconductor integrated circuit is possible.

Consequently, if the power supply voltage is greater than a specified level, sense amplifier control signal SACS and data latch signal DLS are controlled in response to the output signal of ATD circuit 20. If the power supply voltage is less than a specified level, sense amplifier control signal SACS and data latch signal DLS are controlled in response to power detecting signal $\overline{PDS}$.

As may be apparent from the aforementioned description, the illustrated semiconductor integrated circuit has the ATD circuit enabled when the power supply voltage is at a level high enough to enable the sense amplifier or peripheral circuit. Further, when the power supply voltage is greater than a specified level, the semiconductor integrated circuit performs a chip operation in response to the output signal of the ATD circuit. When the power supply voltage is less than a specified level, the chip operation is implemented in response to the power detecting signal generated from the power detecting circuit. Therefore, malfunction of cell data which occurs during power-up is prevented and a normal read operation is implemented. Furthermore, the reliability of the semiconductor integrated circuit is improved.

While there is shown and described the preferred embodiment of the invention, it will be understood by those skilled in the art that foregoing and other changes in form and details may be made without departing from the spirit and scope of the invention. For example, in FIG. 4, although the operation of the ATD circuit is controlled by sensing the voltage level of the power supply voltage connected to the source terminal, a method or means for sensing the power supply voltage may be differently practiced.

What is claimed is:

1. An address transition detecting circuit for use in a semiconductor integrated circuit, said address transition detecting circuit comprising:

power detecting means operably connected to a power source, for detecting a voltage level of said power source and outputting a power detection signal indicative of said voltage level, said power detecting means continuously generating said power detection signal throughout operation of said semiconductor integrated circuit;

first pulse generating means for receiving address signals and generating a first pulse when any address signal differs from an immediately preceding address signal; and summating means for receiving said power detection signal of said power detecting means and said first pulse of said first pulse generating means and generating an output pulse when said summating means has received said first pulse and said power detecting means detects that said power source is at a predetermined level.

2. The address transition detecting circuit as claimed in claim 1, further comprising short pulse generating means for receiving a chip enable signal and generating a short pulse when said chip enable signal is changed.

3. A semiconductor integrated circuit having a memory cell array, and a decoder for designating a memory cell within said memory cell array by decoding an address signal applied from an exterior circuit, said semiconductor integrated circuit comprising:

address transition detecting means for sensing a transition of said address signal;

precharging and equalizing means for receiving an output signal of said address transition detecting means and generating a precharge signal and an equalizing signal;

voltage detecting means for generating a voltage detecting signal by sensing a level of an exterior power supply voltage;

sense amplifier and data latch control means for receiving said equalizing signal and generating a sense amplifier control signal and a data latch control signal in response to said voltage detecting signal; and sense amplifier and data latch means for receiving said precharge signal, said data latch control signal, and said sense amplifier control signal, and for controlling transmission of data to and from said memory cell.

4. The semiconductor integrated circuit as claimed in claim 3, wherein said sense amplifier control signal and said data latch signal are controlled by an output signal of said address transition detecting means when said power supply voltage is greater than a specified voltage level, and wherein said sense amplifier control signal and said data latch signal are controlled by said power detecting signal when said power supply voltage is less than said specified voltage level.

5. The semiconductor integrated circuit as claimed in claim 4, wherein said specified voltage level is 3.0V.

6. The semiconductor integrated circuit as claimed in claim 3, wherein said sense amplifier control signal and said data latch signal are controlled by an output signal of said address transition detecting means when said power supply voltage is greater than a specified voltage level.

7. The semiconductor integrated circuit as claimed in claim 6 wherein said sense amplifier control signal and said data latch signal are controlled by said power detecting signal when said power supply voltage is less than said specified voltage level.

* * * * *